United States Patent
Zhang

(10) Patent No.: US 10,827,137 B2
(45) Date of Patent: Nov. 3, 2020

(54) ALIGNMENT METHOD AND SYSTEM FOR MANUFACTURING MASK INTEGRATION FRAMEWORK

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Xinjian Zhang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 271 days.

(21) Appl. No.: 15/511,112

(22) PCT Filed: Mar. 24, 2016

(86) PCT No.: PCT/CN2016/077241
§ 371 (c)(1),
(2) Date: Mar. 14, 2017

(87) PCT Pub. No.: WO2016/188212
PCT Pub. Date: Dec. 1, 2016

(65) Prior Publication Data
US 2017/0280072 A1 Sep. 28, 2017

(30) Foreign Application Priority Data
May 25, 2015 (CN) .......................... 2015 1 0272246

(51) Int. Cl.
*H04N 5/345* (2011.01)
*G06K 9/46* (2006.01)
(Continued)

(52) U.S. Cl.
CPC ......... *H04N 5/3452* (2013.01); *C23C 14/042* (2013.01); *G06K 9/00355* (2013.01);
(Continued)

(58) Field of Classification Search
CPC ............ G06K 9/38; G06K 9/48; G06K 9/342; G06K 9/4652; G06K 9/00355; H04N 5/3452; C23C 14/042
See application file for complete search history.

(56) References Cited

U.S. PATENT DOCUMENTS 5,046,114 A * 9/1991 Zobel ..................... G06K 9/342
382/171
2006/0245636 A1* 11/2006 Kitamura ................. G06K 9/00
382/149

(Continued)

FOREIGN PATENT DOCUMENTS

CN 102495533 A 6/2012
CN 103165501 A 6/2013
(Continued)

OTHER PUBLICATIONS

English translation of PCT (CN) International Search Report, Application No. PCT/CN2016/077241, dated Jul. 6, 2016, 2 pgs.
(Continued)

*Primary Examiner* — Pinalben Patel
(74) *Attorney, Agent, or Firm* — Armstrong Teasdale LLP

(57) ABSTRACT

An alignment method for manufacturing a mask integration framework is disclosed. The alignment method includes establishing an absolute coordinate system by taking a center of a metal framework as an origin of coordinates, the center of the metal framework coinciding with a center of an array substrate serving as a reference, controlling the array substrate to move, such that an offset of coordinates of a pixel point under the absolute coordinate system with
(Continued)

respect to a predetermined theoretical value is smaller than or equal to a predetermined error value, and transmitting the coordinates of the pixel point under the absolute coordinate system, after the array substrate moves, to a tension device. An alignment system for manufacturing mask integration framework is also disclosed.

8 Claims, 3 Drawing Sheets

(51) Int. Cl.

| | |
|---|---|
| C23C 14/04 | (2006.01) |
| G06K 9/34 | (2006.01) |
| G06K 9/48 | (2006.01) |
| G06K 9/00 | (2006.01) |
| G06K 9/38 | (2006.01) |

(52) U.S. Cl.
CPC .............. *G06K 9/342* (2013.01); *G06K 9/38* (2013.01); *G06K 9/4652* (2013.01); *G06K 9/48* (2013.01)

(56) References Cited

U.S. PATENT DOCUMENTS

2013/0059063 A1* 3/2013 Kawato .................. C23C 14/24
  427/66
2014/0199808 A1* 7/2014 Sugimoto ............... B05B 12/20
  438/99
2017/0260621 A1* 9/2017 Xu ......................... C23C 14/042
2019/0097135 A1* 3/2019 Ichihara .................. C23C 14/50

FOREIGN PATENT DOCUMENTS

| CN | 103167792 A | | 6/2013 | |
|---|---|---|---|---|
| CN | 103205703 A | * | 7/2013 | ........... C23C 14/042 |
| CN | 103205703 A | | 7/2013 | |
| CN | 103292709 A | | 9/2013 | |
| CN | 104122770 A | | 10/2014 | |
| CN | 104894510 A | | 9/2015 | |
| JP | 2010156684 A | | 7/2010 | |
| JP | 2010156685 A | | 7/2010 | |
| KR | 20120013743 A | * | 2/2012 | ......... G03F 7/70791 |

OTHER PUBLICATIONS

PCT (CN) Written Opinion, Application No. PCT/CN2016/077241, dated Jul. 6, 2016, 6 pgs.: with English translation.
China First Office Action, Application No. 201510272246.9, dated Jan. 3, 2017, 15 pgs.: with English translation.

* cited by examiner

ALIGNMENT METHOD AND SYSTEM FOR MANUFACTURING MASK INTEGRATION FRAMEWORK

CROSS REFERENCE TO RELATED APPLICATIONS

This application is a National Stage Entry of PCT/CN2016/077241 filed Mar. 24, 2016, which claims the benefit and priority of Chinese Patent Application No. 201510272246.9 filed on May 25, 2015, the disclosures of which are incorporated by reference herein in their entirety as part of the present application.

BACKGROUND

Exemplary embodiments of the present disclosure relate to an alignment method and system for manufacturing mask integration framework.

Fine metal mask (FMM) processing is to evaporate the organic light emitting diode (OLED) materials onto a low temperature poly-silicon (LTPS) substrate according to pre-defined procedures, thereby forming red, green, blue (RGB) devices using patterns on the FMM. When manufacturing a FMM, a mother glass (i.e., an array substrate which includes thin film transistor (TFT) array only and which is not formed with any OLED material) obtained by an array process is required to be used as a reference for welding, so as to fabricate a mask frame assembly (MFA). Without interference, the charge coupled device (CCD) image sensor may identify a match in pixel position accuracy (PPA) between a pattern on the mother glass and a slit in the mask of the MFA, for example, by measuring the distance between a central position of the slit in the mask of the MFA and the center line of the pattern on the mother glass. However, various deviations may exist when manufacturing the mother glass. For example, the overall position of the pixels may deviate towards a certain direction. Therefore, in the case using a mother glass with deviations as a reference for welding on a FMM Tension Device (which serves to weld the FMM into a large MFA in a metal frame) and when there exists manufacturing deviations in the device, the deviations of the PPA may accumulate during the subsequent MFA evaporation, causing the display device using such MFA at a risk of encountering faulty.

BRIEF DESCRIPTION

The present disclosure provides an alignment method and system for manufacturing mask integration framework, in order to reduce alignment offset in making MFA using the mother glass.

According to a first aspect of the present disclosure, there is provided an alignment method for manufacturing a mask integration framework, including establishing an absolute coordinate system by taking a center of a metal framework as an origin of coordinates, the center of the metal framework coinciding with a center of an array substrate serving as a reference, controlling the array substrate to move, such that an offset of coordinates of a pixel point under the absolute coordinate system with respect to a predetermined theoretical value is smaller than or equal to a predetermined error value, and transmitting the coordinates of the pixel point under the absolute coordinate system, after the array substrate moves, to a tension device.

According to an embodiment of the present disclosure, controlling the array substrate to move, such that an offset of coordinates of a pixel point under the absolute coordinate system with respect to a predetermined theoretical value is smaller than or equal to a predetermined error value includes measuring the offset of coordinates of the pixel point on the array substrate under the absolute coordinate system with respect to the predetermined theoretical value, and controlling the array substrate to move in a direction opposite to an offset direction of the pixel point by a distance of the offset when it is determined that the offset is larger than the predetermined error value.

According to an embodiment of the present disclosure, measuring the offset of coordinates of the pixel point on the array under the absolute coordinate system with respect to the predetermined theoretical value includes measuring a predetermined number of pixel points as samples selected on the array substrate, or measuring a plurality of pixel points on different lines in each of valid pixel arrays on the array substrate.

According to an embodiment of the present disclosure, the predetermined error value is 1.5 μm.

According to an embodiment of the present disclosure, the alignment method further includes transmitting the coordinates of an alignment hole and a thickness measurement area on the array substrate under the absolute coordinate system, after the array substrate moves, to the tension device.

According to an embodiment of the present disclosure, the alignment method further includes storing the coordinates of the pixel point under the absolute coordinate system, after the array substrate moves.

According to a second aspect of the present disclosure, there is provided an alignment system for manufacturing a mask integration framework, including a coordinate system establishment unit configured to establish an absolute coordinate system by taking a center of a metal framework as an origin of coordinates, the center of the metal framework coinciding with a center of an array substrate serving as a reference, a movement control unit configured to control the array substrate to move, such that an offset of coordinates of a pixel point under the absolute coordinate system with respect to a predetermined theoretical value is smaller than or equal to a predetermined error value, and a coordinate transmitting unit configured to transmit the coordinates of the pixel point under the absolute coordinate system, after the array substrate moves, to a tension device.

According to an embodiment of the present disclosure, the movement control unit includes an offset measurement unit configured to measure the offset of coordinates of the pixel point on the array substrate under the absolute coordinate system with respect to the predetermined theoretical value, and a movement determination unit configured to control the array substrate to move in a direction opposite to an offset direction of the pixel point by a distance of the offset when it is determined that the offset is larger than the predetermined error value.

According to an embodiment of the present disclosure, the offset measurement unit is configured to measure at least three pixel points, as samples, on the same line selected in each of valid pixel arrays on the array substrate, or measure a plurality of pixel points, as samples, on different lines in each of valid pixel arrays on the array substrate.

According to an embodiment of the present disclosure, the predetermined error value is 1.5 μm.

According to an embodiment of the present disclosure, the coordinate transmitting unit is also configured to transmit the coordinates of an alignment hole and a thickness measurement area on the array substrate under the absolute coordinate system, after the array substrate moves, to the tension device.

According to the embodiment of the present disclosure, the alignment system further includes a coordinate storage unit configured to store the coordinates of the pixel point under the absolute coordinate system, after the array substrate moves.

According to the alignment method and system for manufacturing mask integration framework according to the embodiments of the present disclosure, by moving the position of the array substrate (i.e., mother glass), the coordinates under the absolute coordinate system are smaller than or equal to a predetermined theoretical value, whereby the alignment deviation is reduced when manufacturing the MFA with said mother glass, thus reducing the risk that the final display device using such MFA encounters faulty.

BRIEF DESCRIPTION OF THE DRAWINGS

To make the technical solution of the embodiments of the present disclosure more clear, the accompanying drawings for illustrating the embodiments of the present disclosure are presented below. Apparently, the accompanying drawings are exemplary only, and those skilled in the art can derive other drawings from such accompanying drawings without creative efforts.

DETAILED DESCRIPTION

With reference to the accompanying drawings, the technical solution of the embodiments of the present disclosure is described clearly and completely as following. Obviously, the given embodiments are only parts of the embodiments of the present disclosure, but not all embodiments of the present disclosure. Based on the embodiments of the present disclosure described herein, all other embodiments which can be obtained without devoting a creative work by those skilled in the art should be deemed to fall into the scope of the present disclosure.

In the description of the present disclosure, it should be noted that the orientation or position relations indicated by the terms "upper", "lower", "top", "bottom" and the like are orientation or position relations based on the drawings. They are only used for facilitating and simplifying the description of the present disclosure, rather than indicating or implying that the indicated devices or elements must have a specific orientation and are constructed and operated in a specific orientation, and therefore cannot be construed as limiting the present disclosure.

Further, in the present disclosure, the terms "first", "second", "third" are for descriptive purposes only, not to be construed to indicate or imply relative importance. The term "a plurality of" refers to two or more, unless otherwise expressly limited.

Figure 1:
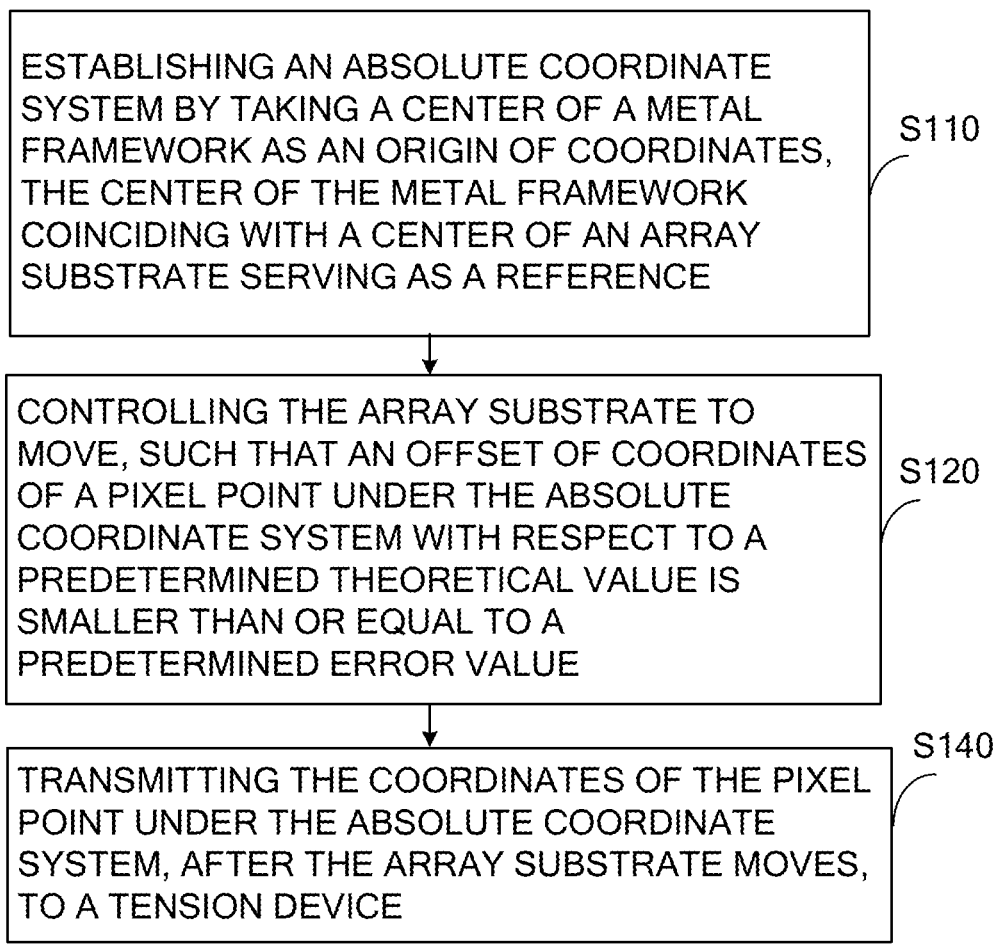
FIG. 1 is a flow diagram illustrating an alignment method for manufacturing mask integration framework according to an embodiment of the present disclosure.

According to an embodiment of the present disclosure, there is provided an alignment method for manufacturing mask integration framework, as shown in FIG. 1, the method may include the following:

step S110, establishing an absolute coordinate system by taking a center of a metal framework as an origin of coordinates, the center of the metal framework coinciding with a center of an array substrate serving as a reference, wherein the array substrate is a mother glass;

step S120, controlling the array substrate to move, such that an offset of coordinates of a pixel point under the absolute coordinate system with respect to a predetermined theoretical value (which is a theoretical design value of various arrangements of desired pixels and which is a standard value having the highest PPA) is smaller than or equal to a predetermined error value; and step S130, transmitting the coordinates of the pixel point under the absolute coordinate system, after the array substrate moves, to a tension device, wherein the tension device is responsible for further fabrication of the MFA according to the coordinates.

According to embodiments of the present disclosure, there is provided an alignment method for manufacturing mask integration framework. In the method, by moving the position of the array substrate (i.e., mother glass), its coordinates under the absolute coordinate system attain a predetermined theoretical value, whereby the alignment deviation is reduced when manufacturing the MFA with said mother glass, thus reducing the risk that the final display device using such MFA encounters faulty.

Figure 2:
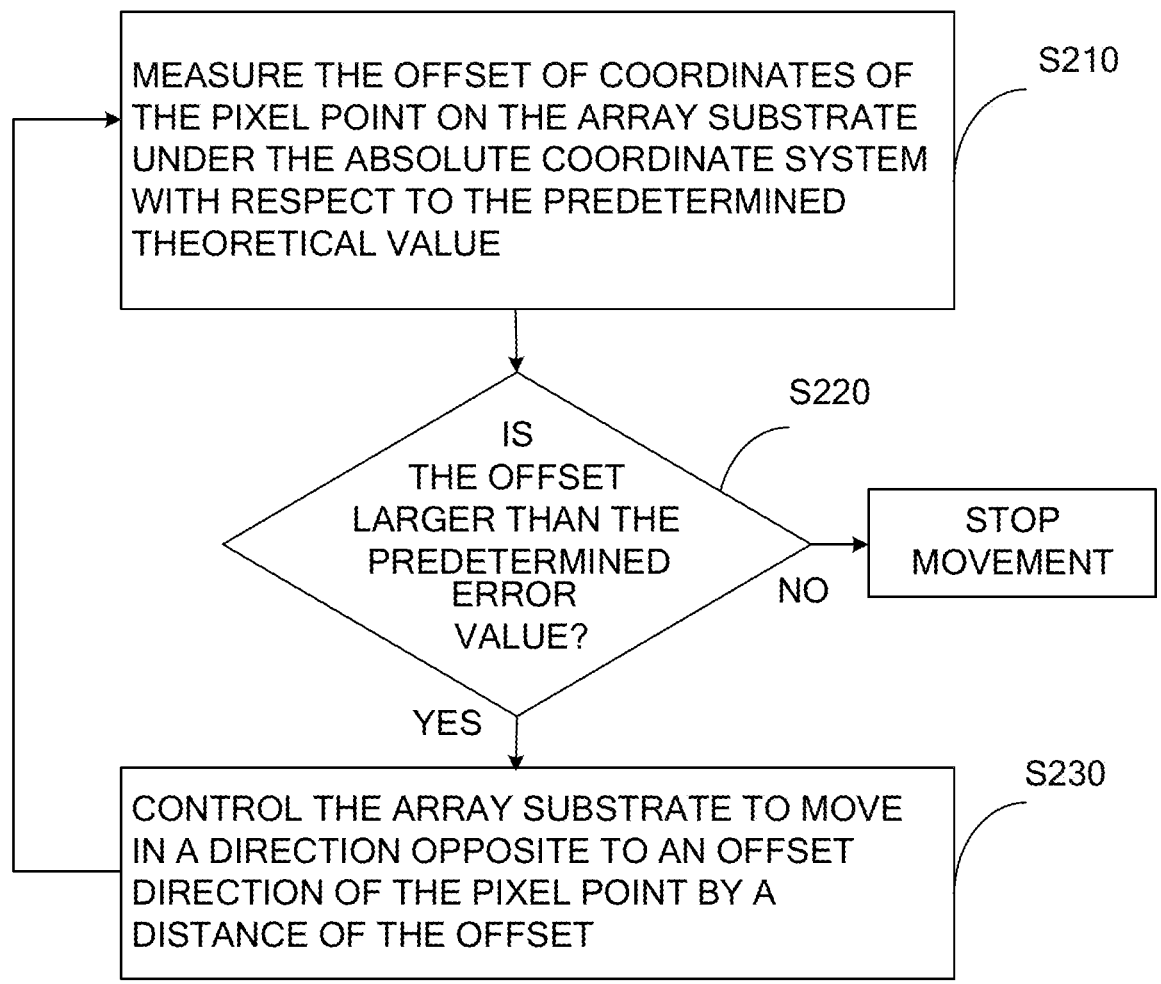
FIG. 2 is a specific flow diagram of S210 shown in FIG. 1.

As shown in FIG. 2, the step S120 may include the following:

step S210, measuring the offset of coordinates of the pixel point on the array substrate under the absolute coordinate system with respect to the predetermined theoretical value;

step S220, determining whether the offset is larger than the preset error value, performing a step S230 if the offset is larger than the preset error value, otherwise stopping the movement of the array substrate; and step S230, controlling the array substrate to move in a direction opposite to an offset direction of the pixel point by a distance of the offset.

The array substrate is generally placed on a bearing platform, which is moved by a robotic arm so as to move the array substrate. Such mechanical movement may result in error, such that the distance of movement in the direction opposite to the offset direction of the pixel points may not be equal to the offset. According to the embodiment of the present disclosure, the process returns to S210 after S230 is completed, that is, S210 to S230 are repetitively performed until the measured offset is not larger than the preset error value.

Since the pixel points move as a whole, it is possible to measure a predetermined number of pixel points on the array substrate as samples. More specifically, at least three pixel points on the same line are measured as samples which are selected in each valid pixel array on the array substrate, based on the linearity of the pixel arrangement and the validity of the pixels.

Figure 3:
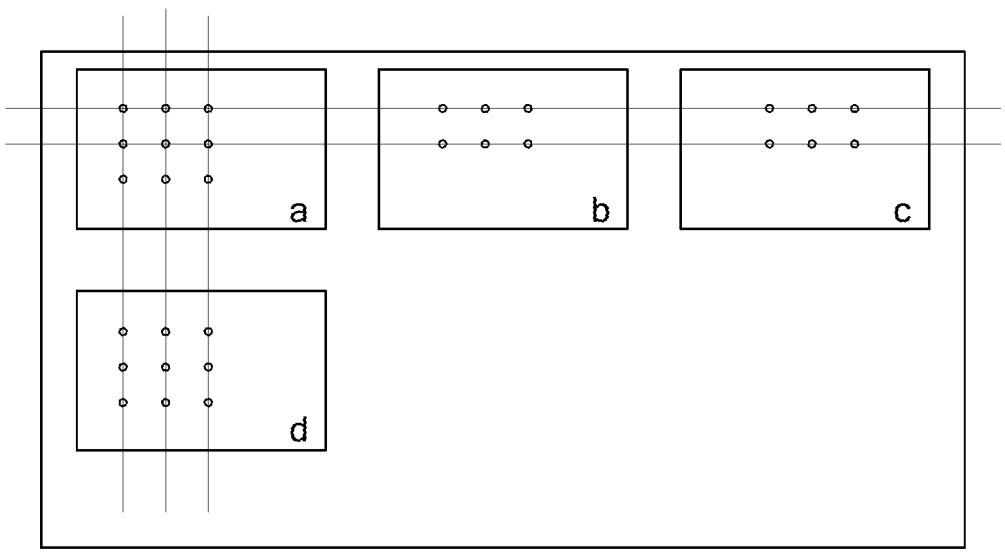
FIG. 3 illustrates a diagram of measuring pixel points, as samples, selected in pixel arrays of the array substrate according to an embodiment of the present disclosure.

The positions of the measurement points are shown in FIG. 3. It can be seen that the array substrate including four pixel arrays (a, b, c, d) can assure linearity of the pixels in either horizontal or vertical direction, thus avoiding overall measurement and adjustment of the absolute coordinates due to relative large deviation of certain points.

According to embodiments of the present disclosure, measuring on two linear lines makes the measurement more accurate and quicker. For example, a plurality of pixel points may be selected in the valid area of each valid pixel array (i.e., cell), and these pixel points are on multiple lines. The measurement on two lines can better reflect the position of pixels in the valid area and is more representative than the measurement on a single line. Six pixel points can be selected from each valid pixel array. In this case, 300 pixel points in total are selected if there are 50 valid pixel arrays (i.e., cell), not only making the measurement more accurate and quicker, but also reducing the times of measurement and enhancing the measurement efficiency in contrast to measuring all pixel points on the entire array substrate.

According to embodiments of the present disclosure, the predetermined error value is 1.5 μm, that is, the offset is not larger than 1.5 μm.

According to embodiments of the present disclosure, the alignment method further includes transmitting the coordinates of an alignment hole and a thickness measurement area on the array substrate under the absolute coordinate system, after the array substrate moves, to the tension device. Therefore, the accuracy of alignment is increased and the error caused by the manufacturing process is reduced.

According to embodiments of the present disclosure, the alignment method further includes storing the coordinates of the pixel point under the absolute coordinate system, after the array substrate moves. After that, the tension device can directly use the stored coordinates to fabricate the MFA when using the array substrates of the same specification.

Figure 4:
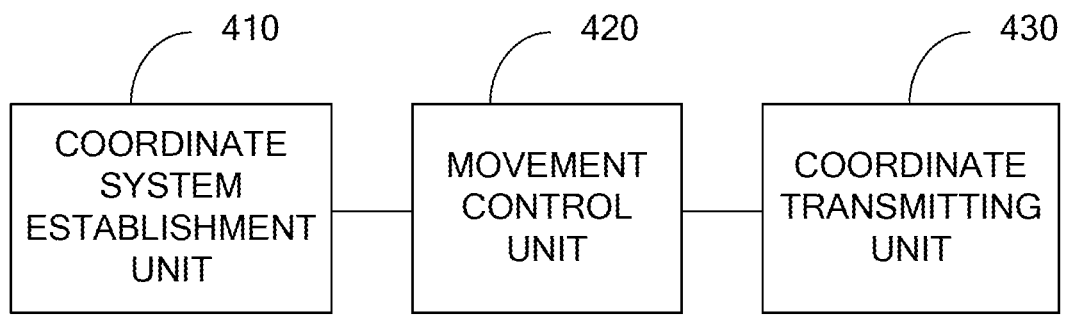
FIG. 4 illustrates a structural diagram of the alignment system for manufacturing mask integration framework according to an embodiment of the present disclosure.

As shown in FIG. 4, according to embodiments of the present disclosure, there is also provided an alignment system for manufacturing a mask integration framework. The alignment system may include a coordinate system establishment unit 410, configured to establish an absolute coordinate system by taking a center of a metal framework as an origin of coordinates, the center of the metal framework coinciding with a center of an array substrate serving as a reference, a movement control unit 420, configured to control the array substrate to move, such that an offset of coordinates of a pixel point under the absolute coordinate system with respect to a predetermined theoretical value is smaller than or equal to a predetermined error value, and a coordinate transmitting unit 430, configured to transmit the coordinates of the pixel point under the absolute coordinate system, after the array substrate moves, to a tension device.

Figure 5:
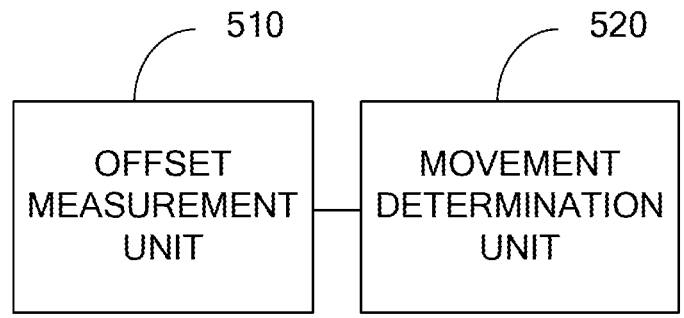
FIG. 5 illustrates a specific structural diagram of the movement control unit 420 as shown in FIG. 4.

As shown in FIG. 5, the movement control unit 420 may include an offset measurement unit 510, configured to measure the offset of coordinates of the pixel point on the array substrate under the absolute coordinate system with respect to the predetermined theoretical value, and a movement determination unit 520, configured to control the array substrate to move in a direction opposite to an offset direction of the pixel point by a distance of the offset when it is determined that the offset is larger than the predetermined error value.

According to embodiments of the present disclosure, the offset measurement unit 510 is further configured to measure at least three pixel points, as samples, on the same line selected in each of valid pixel array on the array substrate.

According to embodiments of the present disclosure, the predetermined error value is 1.5 μm.

According to embodiments of the present disclosure, the coordinate transmitting unit is also configured to transmit the coordinates of an alignment hole and a thickness measurement area on the array substrate under the absolute coordinate system, after the array substrate moves, to the tension device.

According to embodiments of the present disclosure, the alignment system further includes a coordinate storage unit configured to store the coordinates of the pixel point under the absolute coordinate system, after the array substrate moves.

According to embodiments of the present disclosure, there is provided an alignment method and system for manufacturing mask integration framework. By moving the position of the array substrate (i.e., mother glass), its coordinates under the absolute coordinate system are smaller than or equal to a predetermined theoretical value. Therefore, the alignment deviation is reduced when manufacturing the MFA with said mother glass. The risk that the display device using such MFA encounters faulty is reduced.

The foregoing descriptions are merely exemplary specific embodiments of the present disclosure, but are not intended to limit the protection scope of the present disclosure. Any modification or replacement easily thought of by persons skilled in the art without departing from the technical scope of the present disclosure shall all fall within the protection scope of the present disclosure. Therefore, the protection scope of the present disclosure should be subject to the protection scope of the claims.

What is claimed is:

1. An alignment method for manufacturing a mask integration framework, comprising:
    establishing an absolute coordinate system by taking a center of a metal framework as an origin of coordinates, the center of the metal framework coinciding with a center, as a reference, of an array substrate;
    controlling the array substrate to move, such that an offset of coordinates of a pixel point on the array substrate under the absolute coordinate system with respect to a predetermined theoretical value is smaller than or equal to a predetermined error value; and
    transmitting the coordinates of the pixel point under the absolute coordinate system, after the array substrate moves, to a tension device;
    wherein controlling the array substrate to move comprises:
        measuring the offset of coordinates; and
        controlling the array substrate to move in a direction opposite to an offset direction of the pixel point by a distance of the offset when it is determined that the offset is larger than the predetermined error value;
    wherein measuring the offset of coordinates comprises one of i) measuring at least three pixel points, as samples, on a same line selected in each of valid pixel arrays on the array substrate, and ii) measuring a plurality of pixel points, as samples, on different lines selected in each of valid pixel arrays on the array substrate.

2. The alignment method according to claim 1, wherein the predetermined error value is 1.5 μm.

3. The alignment method according to claim 1, further comprising transmitting coordinates of an alignment hole and a thickness measurement area on the array substrate under the absolute coordinate system, after the array substrate moves, to the tension device.

4. The alignment method according to claim 1, further comprising storing the coordinates of the pixel point under the absolute coordinate system, after the array substrate moves.

5. An alignment system for a manufacturing mask integration framework, comprising:
- a coordinate system establishment unit configured to establish an absolute coordinate system by taking a center of a metal framework as an origin of coordinates, the center of the metal framework coinciding with a center, as a reference, of an array substrate;
- a movement control unit configured to control the array substrate to move, such that an offset of coordinates of a pixel point on the array substrate under the absolute coordinate system with respect to a predetermined theoretical value is smaller than or equal to a predetermined error value; and
- a coordinate transmitting unit configured to transmit the coordinates of the pixel point under the absolute coordinate system, after the array substrate moves, to a tension device;
- wherein the movement control unit comprises:
  - an offset measurement unit configured to measure the offset of coordinates, wherein the offset measurement unit is further configured to measure at least one of: i) at least three pixel points, as samples, on a same line selected in each of valid pixel arrays on the array substrate, and ii) measure a plurality of pixel points, as samples, on different lines selected in each of valid pixel arrays on the array substrate; and
  - a movement determination unit configured to control the array substrate to move in a direction opposite to an offset direction of the pixel point by a distance of the offset when it is determined that the offset is larger than the predetermined error value.

6. The alignment system according to claim 5, wherein the predetermined error value is 1.5 µm.

7. The alignment system according to claim 5, wherein the coordinate transmitting unit is further configured to transmit coordinates of an alignment hole and a thickness measurement area on the array substrate under the absolute coordinate system, after the array substrate moves, to the tension device.

8. The alignment system according to claim 5, further comprising a coordinate storage unit configured to store the coordinates of the pixel point under the absolute coordinate system, after the array substrate moves.

* * * * *